United States Patent
Romo et al.

(10) Patent No.: US 11,793,016 B2
(45) Date of Patent: Oct. 17, 2023

(54) SYMMETRICALLY FOLDABLE DISPLAY STACK FOR ELECTRONIC DEVICE

(71) Applicant: Huawei Technologies Co., Ltd., Shenzhen (CN)

(72) Inventors: Jari Romo, Kista (SE); Saku Helle, Kista (SE)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/600,016

(22) PCT Filed: Mar. 29, 2019

(86) PCT No.: PCT/EP2019/058105
§ 371 (c)(1),
(2) Date: Sep. 29, 2021

(87) PCT Pub. No.: WO2020/200409
PCT Pub. Date: Oct. 8, 2020

(65) Prior Publication Data
US 2022/0181579 A1    Jun. 9, 2022

(51) Int. Cl.
*G06F 3/041* (2006.01)
*H10K 50/84* (2023.01)
*H04M 1/02* (2006.01)
*H10K 50/86* (2023.01)
*H10K 59/12* (2023.01)
*H10K 102/00* (2023.01)

(52) U.S. Cl.
CPC ........... *H10K 50/84* (2023.02); *G06F 3/0412* (2013.01); *H04M 1/0268* (2013.01); *H10K 50/86* (2023.02); *G06F 2203/04102* (2013.01); *H10K 59/12* (2023.02); *H10K 2102/311* (2023.02)

(58) Field of Classification Search
None
See application file for complete search history.

(56) References Cited

U.S. PATENT DOCUMENTS

| | | | |
|---|---|---|---|
| 9,356,246 B2 * | 5/2016 | Kawata | ............... H01L 27/1266 |
| 2014/0374710 A1 | 12/2014 | Roh et al. | |
| 2015/0179717 A1 | 6/2015 | Kawata | |
| 2018/0356859 A1 | 12/2018 | Hamburgen et al. | |

FOREIGN PATENT DOCUMENTS

CN      109423226 A      3/2019

* cited by examiner

*Primary Examiner* — Brian M Butcher
(74) *Attorney, Agent, or Firm* — Leydig, Voit & Mayer, Ltd.

(57) ABSTRACT

A foldable display stack for an electronic device comprising a covering structure comprising a first cover layer and a polarizing layer, a second cover layer, and a displaying structure arranged between the covering structure and the second cover layer. A first adhesive layer attaches the covering structure to the displaying structure. A second adhesive layer attaches the displaying structure to the second cover layer. The displaying structure comprises a plurality of layers and the neutral plane of the foldable display stack. The first cover layer is arranged at a first distance from the neutral plane, in a first direction perpendicular to the neutral plane. The second cover layer is arranged at a second distance from the neutral plane, in a second direction opposite to the first direction. The first distance and the second distance are equal.

20 Claims, 1 Drawing Sheet

SYMMETRICALLY FOLDABLE DISPLAY STACK FOR ELECTRONIC DEVICE

CROSS-REFERENCE TO RELATED APPLICATIONS

This application is a national stage of International Application No. PCT/EP2019/058105, filed on Mar. 29, 2019 which is hereby incorporated by reference in its entirety.

TECHNICAL FIELD

Embodiments of the disclosure relate to a symmetrically foldable display stack for an electronic device comprising a covering structure comprising a first cover layer, the display stack further comprising a second covering layer, and a displaying arrangement arranged between the covering structure and the second cover layer.

BACKGROUND

Foldable electronic devices, such as some smartphones, require a foldable display stack. Prior art display stacks comprise a relatively large number of layers, some of which are relatively stiff, such as e.g. metal sheets. The large number of layers makes it difficult to achieve a display stack which is free from permanent deformation and delamination.

Hence, current foldable display stacks are both relatively thick, heavy, and stiff, making them unsuitable for use in dynamically foldable displays. Furthermore, such display stacks can only be folded in one direction, i.e. the display stack can have only an in-fold design or an out-fold design, not both. Additionally, current in-fold designs may have a permanent deformation of >17%, and current out-fold designs may have a permanent deformation of >8%, the maximum stress in the material layers being >>100 MPa.

SUMMARY

It is an object to provide an improved foldable display stack. The foregoing and other objects are achieved by the features of the independent claims. Further implementation forms are apparent from the dependent claims, the description, and the figures.

According to a first aspect, there is provided a foldable display stack for an electronic device comprising a covering structure. The covering structure comprises a first cover layer and a polarizing layer, a second cover layer, a displaying structure arranged between the covering structure and the second cover layer, a first adhesive layer attaching the covering structure to the displaying structure, a second adhesive layer attaching the displaying structure to the second cover layer, the displaying structure comprising a plurality of layers, the displaying structure comprising the neutral plane of the foldable display stack.

The first cover layer being arranged at a first distance from the neutral plane, in a first direction perpendicular to the neutral plane. The second cover layer being arranged at a second distance from the neutral plane, in a second direction opposite to the first direction. The first distance and the second distance being equal. The display stack being foldable by an equal amount, from an unfolded position, in the first direction to a first folded position and in the second direction to a second folded position.

Such a solution facilitates a display stack which is thinner and more flexible than prior art, which is necessary in order to achieve a symmetrically foldable display stack. Furthermore, the present solution has better reliability than prior art solutions, substantially eliminating delamination of, and permanent deformation, to the display stack.

In a possible implementation form of the first aspect, at least one of the first cover layer and the second cover layer comprises optical clear materials. Optical clear materials can be used in layers to make it possible to see display image through cover layer and adhesive layer.

In a possible implementation form of the first aspect, at least one layer of the displaying structure is an OLED panel layer or an AMOLED panel layer, facilitating choosing a suitable display structure considering optical and mechanical restrictions.

In a further possible implementation form of the first aspect, the first cover layer and the second cover layer have an elasticity $\varepsilon \geq 5\%$ of a width of the first cover layer and the second cover layer, the width extending in a direction perpendicular to the first direction and the second direction, facilitating a significant reduction in the maximum stress and permanent deformation of the display stack.

In a further possible implementation form of the first aspect, any deformation occurring as the display stack is folded from the unfolded position to one of the first folded position or the second folded position, is reversed as the display stack is unfolded from the first folded position or the second folded position to the unfolded position, allowing bump free folding, meaning no bump occurs in the middle of the display stack even after having been folded and unfolded many times.

In a further possible implementation form of the first aspect, the first cover layer and the second cover layer comprises of polymer material, preferably polyimide.

In a further possible implementation form of the first aspect, the displaying structure further comprises a touch sensor.

In a further possible implementation form of the first aspect, the displaying structure further comprises a touch sensor layer and a third adhesive layer, the third adhesive layer attaching the touch sensor layer to the panel layer.

In a further possible implementation form of the first aspect, the third adhesive layer is a pressure sensitive adhesive.

In a further possible implementation form of the first aspect, the polarizing layer is arranged between the first cover layer and the first adhesive layer.

In a further possible implementation form of the first aspect, the covering structure further comprises a hard coating attached to the first cover layer, providing additional protection to the outer surface of the cover layer.

In a further possible implementation form of the first aspect, the polarizing layer is arranged between the first cover layer and the hard coating, providing additional protection to the polarizing layer.

In a further possible implementation form of the first aspect, the polarizing layer is coated directly onto the first cover layer, eliminating the need for additional adhesive or support layers.

In a further possible implementation form of the first aspect, the first cover layer comprises a plurality of sub-layers being attached to each other by a fourth adhesive layer, the polarizing layer being coated directly onto one of the sub-layers, facilitating flexibility in the design of the covering structure.

In a further possible implementation form of the first aspect, at least one of the first, second, third, and fourth adhesive layers comprise optically clear adhesive.

In a further possible implementation form of the first aspect, at least one of the first, second, third, and fourth adhesive layers comprise an optically clear adhesive with anti-shock properties, providing a cushioning effect to the display stack.

In a further possible implementation form of the first aspect, the covering structure, the first adhesive layer, and at least the touch sensor layer of the displaying structure are transparent.

In a further possible implementation form of the first aspect, the first cover layer and the second cover layer have the same material properties, such as the same elasticity.

In a further possible implementation form of the first aspect, the display stack has is symmetrically stacked up in relation to the neutral plane of the displaying structure. For example, the distance between the first cover layer and the neutral plane is the same as the distance between the second cover layer and the neutral plane.

In a further possible implementation form of the first aspect, the display stack has is symmetrically stacked up in relation to the displaying structure. For example, the distance between the first cover layer and the displaying structure is the same as the distance between the second cover layer and the displaying structure.

For example, materials properties at the one end of the displaying structure, e.g. in a first direction D1 perpendicular to the neutral plane are similar to the other end of the displaying structure, e.g. in a second direction D2 perpendicular to the neutral plane. The direction of D1 is opposite to the direction of D2.

This provides the advantage of a "bumpfree" folding, which means no bump in the middle when folded or after folding many times, a symmetrical stack up in relation to the displaying structure. As the protective cover layer elasticity shall be the similar to the elasticity of the bottom cover layer, both layers shall have equal capability to fold in and out.

In a further possible implementation form of the first aspect, the first cover layer is composed of a first cover material, the second cover layer is composed of a second cover material, wherein the first cover material and the second cover material are similar, in some cases they can be the same.

In a further possible implementation form of the first aspect, the first adhesive layer is composed of a first adhesive material, the second adhesive layer is composed of a second adhesive material, wherein the first adhesive material and the second adhesive material are the same.

In a further possible implementation form of the first aspect, at least one of the first adhesive layer and the second adhesive layer is attached to an anti-shock layer.

In a further possible implementation form of the first aspect, the first adhesive layer is attached to a first anti-shock layer, the second adhesive layer is attached to a second anti-shock layer, wherein the material properties, e.g. elasticity, of the first adhesive layer and the attached first anti-shock layer are the same as the material properties, e.g. elasticity, of the second adhesive layer and the attached second anti-shock layer.

According to a second aspect, there is provided an electronic device comprising a foldable display stack according to the above, wherein a peripheral surface of the electronic device comprises the hard coating or the first cover layer of the foldable display stack, facilitating an electronic device having a display which is symmetrically foldable and which is lighter and has better reliability than prior art solutions.

This and other aspects will be apparent from and the embodiments described below.

BRIEF DESCRIPTION OF THE DRAWINGS

In the following detailed portion of the present disclosure, the aspects, embodiments and implementations will be explained in more detail with reference to the example embodiments shown in the drawings, in which.

DETAILED DESCRIPTION

The present disclosure relates to an electronic device comprising a display stack 1. A peripheral layer of the foldable display stack 1, such as the hard coating 10 or the first cover layer 3, described in more detail below, makes up a peripheral surface of the electronic device. The peripheral surface may, e.g., be a part of the front surface of the electronic device, the entire front surface of the electronic device, or the front surface and one or more side surfaces of the electronic device.

Figure 1:
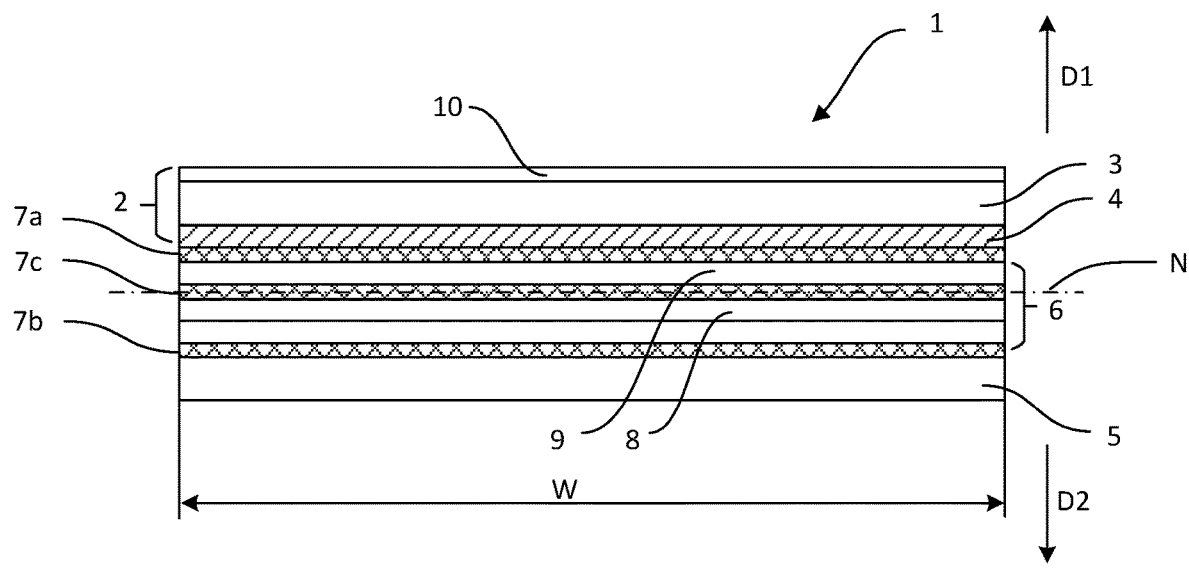
FIG. 1 shows a schematic illustration of a display stack in accordance with an embodiment of the present invention.
Figure 2:
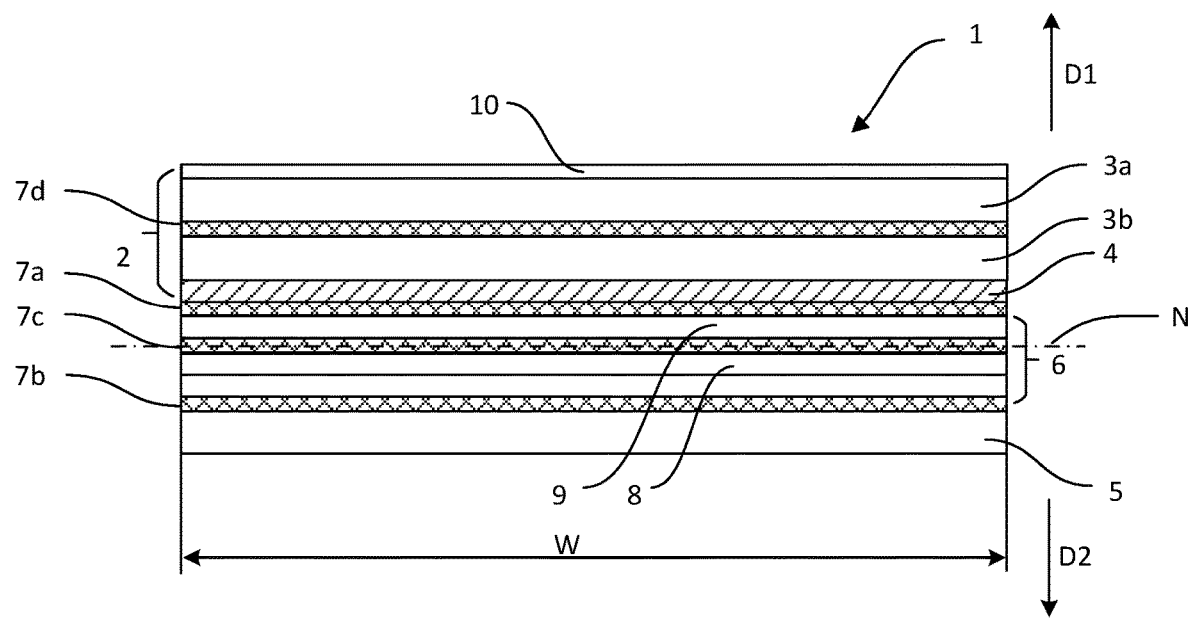
FIG. 2 shows a schematic illustration of a display stack in accordance with a further embodiment of the present invention.

Different embodiments of the display stack 1 are shown in FIGS. 1 and 2. The display stack 1 comprises a covering structure 2, comprising a first cover layer 3 and a polarizing layer 4, and a second cover layer 5. The display stack 1 further comprises a displaying structure 6 arranged between the covering structure 2 and the second cover layer 5. All layers of the display stack 1 extend in parallel with each other, and in parallel with a main plane of the display stack 1. Furthermore, all layers, except for the two peripheral layers at either side of the display stack 1, are arranged in direct abutment with two adjacent layers, since there are no air gaps within the display stack 1.

In one embodiment, the polarizing layer 4 comprises a circular polarizer comprising a linear polarizer and a quarter wave plate. The polarizing layer 4 may comprise only one material, preferably a liquid crystal polymer material. The polarizing layer 4 may furthermore comprise of two sub-layers coated onto each other. For example, for a circular polarizer comprising a linear polarizer sub-layer and a quarter wave sub-layer, the two sub-layers are coated as separate layers, the two sub-layers comprising of the same base material but having different polymer molecule orientation.

Regardless of the location of the polarizing layer 4, the polarizing layer 4 may be coated directly onto one adjacent layer, and attached to another adjacent layer by means of an adhesive layer. As shown in FIG. 1, the polarizing layer 4 may be coated directly onto the first cover layer 3. As shown in FIG. 2, the polarizing layer 4 may be coated directly onto a sub-layer 3a, 3b of the first cover layer 3. The polarizing layer 4 may furthermore be attached to both adjacent layers by means of adhesive layers.

The display stack 1 further comprises a first adhesive layer 7a attaching the covering structure 2 to the displaying structure 6, and a second adhesive layer 7b attaching the displaying structure 6 to the second cover layer 5. The polarizing layer 4 may be arranged between the first cover layer 3 and the first adhesive layer 7a, as shown in FIG. 1.

The displaying structure 6 comprises a plurality of layers. At least one layer of the displaying structure 6 may be an OLED panel layer or an AMOLED panel layer 8. One layer may be a base film. As opposed to prior art, there is no need for neither support layers such as metal sheets nor separate cushioning layers.

The displaying structure 6 may further comprise a touch sensor, located within the panel layer 8 (not shown). The displaying structure 6 may furthermore comprise a touch sensor layer 9 and a third adhesive layer 7c, the third adhesive layer 7c attaching the touch sensor layer 9 to the panel layer 8. The third adhesive layer 7c may be a pressure sensitive adhesive. In one embodiment (not shown), the polarizer layer 4 may be coated directly onto the touch sensor layer 9, whereafter the polarizer layer 4 is attached to the first cover layer 3 or sub-layer 3b by means of the first adhesive layer 7a.

In one embodiment, at least the covering structure 2, the first adhesive layer 7a, and at least the touch sensor layer 9 of the displaying structure 6 are transparent.

As shown in FIGS. 1 and 2, the covering structure 2 may furthermore comprise a hard coating 10 attached to the first cover layer 3 or a sub-layer 3a.

FIG. 1 shows one integral first cover layer 3. For such embodiments, the polarizing layer 4 may be arranged between the first cover layer 3 and the first adhesive layer 7a, or between the first cover layer 3 and the hard coating 10 (not shown). The polarizing layer 4 may be coated directly onto the first cover layer 3.

As shown in FIG. 2, the first cover layer 3 may comprise of a plurality of sub-layers 3a, 3b, e.g. two sub-layers, each pair of sub-layers 3a, 3b being attached to each other by means of a fourth adhesive layer 7d. For such embodiments, the polarizing layer 4 may be coated directly onto one of the sub-layers 3a, 3b. In embodiments comprising at least two cover layers 3a, 3b, the polarizing layer 4 may be arranged between the cover layer 3b and the first adhesive layer 7a, as shown in FIG. 2. Furthermore, the polarizing layer 4 may be arranged between the cover layer 3a and the hard coating 10 (not shown).

As shown in FIGS. 1 and 2, the displaying structure 6 comprises the neutral plane N of the foldable display stack 1. The neutral plane of the foldable display stack 1 is the plane in which, regardless of folding, the material is not under stress, by neither compression nor tension.

The first cover layer 3 is arranged at a first distance from the neutral plane N, in a first direction D1 perpendicular to the neutral plane N. The second cover layer 5 is arranged at a second distance from the neutral plane N, in a second direction D2 opposite to the first direction D1. The first distance and the second distance are equal, which allows the display stack 1 to fold symmetrically, by an equal amount in both directions. Hence, the display stack 1 may fold, from the unfolded position shown in FIGS. 1 and 2, in the first direction D1 to a first folded position. In the first folded position, the first cover layer 3 is subject to compression forces and the second cover layer 5 is subject to tension forces. The display stack 1 may also fold, from the unfolded position shown in FIGS. 1 and 2, in the second direction D2 to a second folded position. In the second folded position, the first cover layer 3 is subject to tension forces and the second cover layer 5 is subject to compression forces.

In one embodiment, the first cover layer 3 and the second cover layer 5 comprise of polymer material, preferably polyimide. The first cover layer 3 and the second cover layer 5 may comprise of the same material or different materials having similar properties.

The same is true for the adhesive layers 7a to 7d. Two or more of the adhesive layers 7a to 7d may comprise of the same material or different materials having similar properties.

At least one of the first, second, third, and fourth adhesive layers 7a, 7b, 7c, 7d may comprise optically clear adhesive. Preferably, at least the first adhesive layer 7a comprises optically clear adhesive. Even more preferably, the first adhesive layer 7a and the second adhesive layer 7b both comprise the same optically clear adhesive. Furthermore, at least one of the first, second, third, and fourth adhesive layers 7a, 7b, 7c, 7d may comprise an optically clear adhesive with anti-shock properties. Preferably, at least the first adhesive layer 7a comprises an optically clear adhesive with anti-shock properties. In one embodiment, the third adhesive layer 7c is an optically clear, pressure sensitive adhesive.

In one embodiment, the first cover layer 3 and the second cover layer 5 have an elasticity $\varepsilon \geq 5\%$ of the width W of the first cover layer 3 and the second cover layer 5. The width W extends in a direction perpendicular to the first direction D1 and the second direction D2, i.e. between the two long edges of the display stack 1 and the electronic device. The display stack 1 is folded along a line which extends parallel with the neutral plane and perpendicular to the width W.

The combined properties of the layers of the foldable display stack 1, in particular the adhesive layers and the cover layers, are preferably the same for the top half of the display stack 1, i.e., the half which is located above the neutral plane N and includes the first cover layer 3, as for the bottom half of the display stack 1, i.e. the half which is located below the neutral plane N and includes the second cover layer 5. Hence, the first adhesive layer 7a may have different properties than the second adhesive layer 7b, and similarly the first cover layer 3 may have different properties than the second cover layer 5, as long as the material combination in each half results in the same properties.

Preferably, any deformation occurring as the display stack 1 is folded from the unfolded position to the first folded position or the second folded position, is at least significantly reversed as the display stack 1 is unfolded from the first folded position or the second folded position to the unfolded position. Permanent deformation may be decreased by 90% compared to prior art, while the maximum stress in the material layers can be decreased by 70%.

The various aspects and implementations have been described in conjunction with various embodiments herein. However, other variations to the disclosed embodiments can be understood and effected by those skilled in the art in practicing the claimed subject-matter, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The reference signs used in the claims shall not be construed as limiting the scope.

The invention claimed is:

1. A foldable display stack for an electronic device comprising
   a covering structure comprising a first cover layer and a polarizing layer;
   a second cover layer;
   a displaying structure arranged between the covering structure and the second cover layer;

a first adhesive layer attaching the covering structure to the displaying structure;
a second adhesive layer attaching the displaying structure to the second cover layer;
wherein the displaying structure comprises a plurality of layers and a neutral plane of the foldable display stack,
wherein the first cover layer is arranged at a first distance from the neutral plane, in a first direction perpendicular to the neutral plane,
wherein the second cover layer is arranged at a second distance from the neutral plane, in a second direction opposite to the first direction, and
wherein the first distance and the second distance are equal; and
the display stack being foldable by an equal amount, from an unfolded position, in the first direction to a first folded position and in the second direction to a second folded position,
wherein the first cover layer comprises a plurality of sub-layers being attached to each other by a fourth adhesive layer, and
wherein the polarizing layer is coated directly onto one of the sub-layers.

2. The foldable display stack according to claim 1, wherein at least one layer of the displaying structure is an OLED panel layer or an AMOLED panel layer.

3. The foldable display stack according to claim 1, wherein the first cover layer and the second cover layer have an elasticity ε≥5% of a width of the first cover layer and the second cover layer, the width extending in a direction perpendicular to the first direction and the second direction.

4. The foldable display stack according to claim 1, wherein any deformation occurring as the display stack is folded from the unfolded position to one of the first folded position or the second folded position, is reversed as the display stack is unfolded from the first folded position or the second folded position to the unfolded position.

5. The foldable display stack according to claim 1, wherein the first cover layer and the second cover layer comprise of polymer material including polyimide.

6. The foldable display stack according to claim 1, wherein the displaying structure further comprises a touch sensor layer and a third adhesive layer, the third adhesive layer attaching the touch sensor layer to a panel layer of the displaying structure.

7. The foldable display stack according to claim 1, wherein the displaying structure further comprises a touch sensor.

8. The foldable display stack according to claim 1, wherein the covering structure further comprises a hard coating attached to the first cover layer.

9. The foldable display stack according to claim 6, wherein at least one of the first, second, third, and fourth adhesive layers comprise optically clear adhesive.

10. The foldable display stack according to claim 1, wherein the first cover layer and the second cover layer have the same elasticity.

11. The foldable display stack according to claim 10, wherein the first cover layer is composed of a first cover material, the second cover layer is composed of a second cover material, wherein the first cover material and the second cover material are the same.

12. The foldable display stack according to claim 1, wherein the first adhesive layer is composed of a first adhesive material, the second adhesive layer is composed of a second adhesive material, wherein the first adhesive material and the second adhesive material are the same.

13. The foldable display stack according to claim 1, wherein at least one of the first adhesive layer and the second adhesive layer is attached to an anti-shock layer.

14. The foldable display stack according to claim 13, wherein the first adhesive layer is attached to a first anti-shock layer, the second adhesive layer is attached to a second anti-shock layer, wherein material properties of the first adhesive layer and the attached first anti-shock layer are the same as material properties of the second adhesive layer and the attached second anti-shock layer.

15. An electronic device comprising a foldable display stack, wherein the foldable display stack comprises:
a covering structure comprising a first cover layer and a polarizing layer;
a second cover layer;
a displaying structure arranged between the covering structure and the second cover layer;
a first adhesive layer attaching the covering structure to the displaying structure;
a second adhesive layer attaching the displaying structure to the second cover layer,
wherein the displaying structure comprises a plurality of layers and a neutral plane of the foldable display stack,
wherein the first cover layer is arranged at a first distance from the neutral plane, in a first direction perpendicular to the neutral plane,
wherein the second cover layer is arranged at a second distance from the neutral plane, in a second direction opposite to the first direction, and
wherein the first distance and the second distance are equal;
the display stack being foldable by an equal amount, from an unfolded position, in the first direction to a first folded position and in the second direction to a second folded position,
wherein a peripheral surface of the electronic device comprises a hard coating of the first cover layer of the foldable display stack;
wherein the first cover layer comprises a plurality of sub-layers attached to each other by a fourth adhesive layer, and
wherein a polarizing layer is coated directly onto one of the sub-layers.

16. The electronic device according to claim 15, wherein the first cover layer and the second cover layer have an elasticity ε≥5% of a width of the first cover layer and the second cover layer, and wherein the width extending in a direction substantially perpendicular to the first direction and the second direction.

17. The electronic device according to claim 15, wherein the displaying structure further comprises a touch sensor layer and a third adhesive layer, and wherein the third adhesive layer attaches the touch sensor layer to a panel layer of the displaying structure.

18. A foldable display stack for an electronic device comprising
a covering structure comprising a first cover layer and a polarizing layer;
a second cover layer;
a displaying structure arranged between the covering structure and the second cover layer;
a first adhesive layer attaching the covering structure to the displaying structure;

a second adhesive layer attaching the displaying structure to the second cover layer,
  wherein the displaying structure comprises a plurality of layers and a neutral plane of the foldable display stack,
  wherein the first cover layer is arranged at a first distance from the neutral plane, in a first direction perpendicular to the neutral plane,
  wherein the second cover layer is arranged at a second distance from the neutral plane, in a second direction opposite to the first direction, and
  wherein the first distance and the second distance are equal; and
the display stack being foldable by an equal amount, from an unfolded position, in the first direction to a first folded position and in the second direction to a second folded position,
  wherein the first cover layer and the second cover layer have an elasticity $\varepsilon \geq 5\%$ of a width of the first cover layer and the second cover layer, and
  wherein the width extends in a direction substantially perpendicular to the first direction and the second direction.

19. The foldable display stack according to claim 18, wherein the displaying structure further comprises a touch sensor layer and a third adhesive layer, and wherein the third adhesive layer attaches the touch sensor layer to a panel layer of the displaying structure.

20. The foldable display stack according to claim 18, wherein at least one of the first adhesive layer and the second adhesive layer is attached to an anti-shock layer.

\* \* \* \* \*

UNITED STATES PATENT AND TRADEMARK OFFICE
CERTIFICATE OF CORRECTION

| | | |
|---|---|---|
| PATENT NO. | : 11,793,016 B2 | Page 1 of 1 |
| APPLICATION NO. | : 17/600016 | |
| DATED | : October 17, 2023 | |
| INVENTOR(S) | : Romo et al. | |

It is certified that error appears in the above-identified patent and that said Letters Patent is hereby corrected as shown below:

In the Claims

Claim 15: Column 8, Line 42: "the foldable display stack;" should read -- the foldable display stack, --.

Signed and Sealed this
Thirtieth Day of January, 2024

Katherine Kelly Vidal
*Director of the United States Patent and Trademark Office*